United States Patent
Kawasaki

(10) Patent No.: US 10,270,421 B2
(45) Date of Patent: Apr. 23, 2019

(54) ELASTIC WAVE DEVICE AND METHOD FOR MANUFACTURING THE SAME

(71) Applicant: Murata Manufacturing Co., Ltd., Nagaokakyo-shi, Kyoto-fu (JP)

(72) Inventor: Kentaro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/151,367

(22) Filed: Oct. 4, 2018

(65) Prior Publication Data

US 2019/0044498 A1 Feb. 7, 2019

Related U.S. Application Data

(63) Continuation of application No. PCT/JP2017/007829, filed on Feb. 28, 2017.

(30) Foreign Application Priority Data

Apr. 25, 2016 (JP) .................. 2016-086907

(51) Int. Cl.
*H03H 3/08* (2006.01)
*H03H 9/25* (2006.01)
(Continued)

(52) U.S. Cl.
CPC .............. *H03H 9/145* (2013.01); *H03H 3/08* (2013.01); *H03H 9/25* (2013.01); *H03H 9/6489* (2013.01)

(58) Field of Classification Search
CPC ........ H03H 3/08; H03H 3/10; H03H 9/02535; H03H 9/145; H03H 9/25; H03H 9/64; H03H 9/6489

(Continued)

(56) References Cited

U.S. PATENT DOCUMENTS 6,377,138 B1 * 4/2002 Takagi ............... H03H 3/08 310/313 B
7,327,205 B2 * 2/2008 Taniguchi ........... H03H 9/605 333/133

(Continued)

FOREIGN PATENT DOCUMENTS

JP 2000-068784 A * 3/2000
JP 2000-196409 A * 7/2000

(Continued)

OTHER PUBLICATIONS

English language machine translation of JP 2000-196409 A, published Jul. 14, 2000, 4 pages. (Year: 2000).*

(Continued)

*Primary Examiner* — Barbara Summons
(74) *Attorney, Agent, or Firm* — Keating & Bennett, LLP

(57) ABSTRACT

An elastic wave device includes a piezoelectric substrate, first to third IDT electrodes provided on the piezoelectric substrate, a dielectric film provided on the piezoelectric substrate and covering the first to third IDT electrodes, the thickness of the dielectric film in a first region in which the dielectric film covers the first IDT electrodes is different from the thickness of the dielectric film in a second region in which the dielectric film covers the second IDT electrodes and the thickness of the dielectric film in a third region in which the dielectric film covers the third IDT electrodes. The density equivalent thickness of each of the first IDT electrodes and the second IDT electrodes are equal to each other, and the density equivalent thickness of each of the third IDT electrodes is different from the density equivalent thickness of each of the first IDT electrodes and the second IDT electrodes.

12 Claims, 4 Drawing Sheets

(51) Int. Cl.
*H03H 9/64* (2006.01)
*H03H 9/145* (2006.01)

(58) Field of Classification Search
USPC .......... 333/133, 193–196; 310/313 B, 313 D
See application file for complete search history.

(56) References Cited

U.S. PATENT DOCUMENTS

| 2003/0038562 | A1 | 2/2003 | Ikada et al. |
| 2005/0174200 | A1 | 8/2005 | Lee et al. |
| 2007/0241841 | A1* | 10/2007 | Hauser ................. H03H 9/6423 333/193 |
| 2008/0074212 | A1 | 3/2008 | Matsuda et al. |
| 2015/0349748 | A1* | 12/2015 | Bauer .................... H03H 9/542 333/133 |

FOREIGN PATENT DOCUMENTS

| JP | 2000-341068 A | 12/2000 |
| JP | 2002-232264 A | 8/2002 |
| JP | 2005-223876 A | 8/2005 |
| JP | 2008-079227 A | 4/2008 |
| WO | 2016/027707 A1 | 2/2016 |

OTHER PUBLICATIONS

English language machine translation of JP 2000-068784 A, published Mar. 3, 2000, 4 pages. (Year: 2000).*
Official Communication issued in International Patent Application No. PCT/JP2017/007829, dated May 16, 2017.

* cited by examiner

ELASTIC WAVE DEVICE AND METHOD FOR MANUFACTURING THE SAME

CROSS REFERENCE TO RELATED APPLICATIONS

This application claims the benefit of priority to Japanese Patent Application No. 2016-086907 filed on Apr. 25, 2016 and is a Continuation Application of PCT Application No. PCT/JP2017/007829 filed on Feb. 28, 2017. The entire contents of each application are hereby incorporated herein by reference.

BACKGROUND OF THE INVENTION

1. Field of the Invention

The present invention relates to an elastic wave device and a method for manufacturing the elastic wave device.

2. Description of the Related Art

In the related art, elastic wave devices have been widely used in filters of cellular phones. For example, Japanese Unexamined Patent Application Publication No. 2000-341068 discloses an elastic wave device that includes two elastic wave filters formed on the same piezoelectric substrate. Each of the two elastic wave filters includes an insulating film that is formed so as to cover an IDT electrode of the elastic wave filter. The film thickness of the IDT electrode and the film thickness of the insulating film in one of the elastic wave filters are respectively larger than the film thickness of the IDT electrode and the film thickness of the insulating film in the other of the elastic wave filters. The insertion losses of the elastic wave filters is able to be reduced by optimizing the film thicknesses of the IDT electrodes and the film thicknesses of the insulating films.

In Japanese Unexamined Patent Application Publication No. 2000-341068, the IDT electrodes of the two elastic wave filters are formed in different processes in order to cause the IDT electrode and the insulating film of one of the two elastic wave filters to have film thicknesses different from the film thicknesses of the IDT electrode and the insulating film of the other of the two elastic wave filters. Similarly, in the case in which an elastic wave device that includes three elastic wave filters is fabricated, the insertion losses of the elastic wave filters are able to be reduced by causing IDT electrodes of the three elastic wave filters to have different film thicknesses and by causing insulating films of the three elastic wave filters to have different film thicknesses. However, in this method, a process of forming an IDT electrode needs to be performed three times, and thus, the productivity may not be sufficiently improved.

SUMMARY OF THE INVENTION

Preferred embodiments of the present invention provide elastic wave devices capable of improving productivity and reducing insertion loss and methods for manufacturing the elastic wave devices.

An elastic wave device according to a preferred embodiment the present invention includes a piezoelectric substrate, first to third IDT electrodes that are provided on the piezoelectric substrate, and a dielectric film that is provided on the piezoelectric substrate such that the dielectric film covers the first to third IDT electrodes and such that a thickness of the dielectric film in a region in which the dielectric film covers the first IDT electrode is different from a thickness of the dielectric film in a region in which the dielectric film covers the second IDT electrode and a thickness of the dielectric film in a region in which the dielectric film covers the third IDT electrode. Thus, first to third elastic wave elements that include the first to third IDT electrodes and the dielectric film are provided. When a thickness is converted into a density equivalent thickness on an assumption that materials of the first to third IDT electrodes have the same or substantially the same density, the density equivalent thicknesses of the first and second IDT electrodes are equal or substantially equal to each other, and the density equivalent thickness of the third IDT electrode is different from each of the density equivalent thicknesses of the first and second IDT electrodes.

In an elastic wave device according to a preferred embodiment of the present invention, the first to third IDT electrodes have electrode finger pitches that are different from one another.

In an elastic wave device according to a preferred embodiment of the present invention, when the density equivalent thickness of the dielectric film is a thickness converted on an assumption that materials of the dielectric film and the first to third IDT electrodes have the same or substantially the same density, a ratio of the sum of the density equivalent thickness of the dielectric film located on the first IDT electrode and the density equivalent thickness of the first IDT electrode to the electrode finger pitch of the first IDT electrode, a ratio of the sum of the density equivalent thickness of the dielectric film located on the second IDT electrode and the density equivalent thickness of the second IDT electrode to the electrode finger pitch of the second IDT electrode, and a ratio of the sum of the density equivalent thickness of the dielectric film located on the third IDT electrode and the density equivalent thickness of the third IDT electrode to the electrode finger pitch of the third IDT electrode are different from one another. In this case, the insertion losses of the first to third elastic wave elements are effectively reduced.

In an elastic wave device according to a preferred embodiment of the present invention, the first to third elastic wave elements are first to third elastic wave filters.

In an elastic wave device according to a preferred embodiment of the present invention, the materials of the first and second IDT electrodes and the material of the third IDT electrode are different from each other.

A method for manufacturing an elastic wave device according to a preferred embodiment of the present invention includes preparing a piezoelectric substrate, providing first and second IDT electrodes on the piezoelectric substrate, providing a third IDT electrode on the piezoelectric substrate, and forming a dielectric film on the piezoelectric substrate such that the dielectric film covers the first to third IDT electrodes and such that a thickness of the dielectric film in a region in which the dielectric film covers the first IDT electrode is different from a thickness of the dielectric film in a region in which the dielectric film covers the second IDT electrode and a thickness of the dielectric film in a region in which the dielectric film covers the third IDT electrode. Thus, first to third elastic wave elements that include the first to third IDT electrodes and the dielectric film are formed. In the step of providing the first and second IDT electrodes and in the step of providing the third IDT electrode, when a thickness is converted into a density equivalent thickness on an assumption that materials of the first to third IDT electrodes have the same or substantially the same density, the density equivalent thicknesses of the first and second IDT electrodes are set to be equal or substantially equal to each other, and the density equivalent thickness of the third IDT electrode is set to be different from each of the density equivalent thicknesses of the first and second IDT electrodes.

In a method for manufacturing an elastic wave device according to a preferred embodiment of the present invention, in the providing the first and second IDT electrodes and in the step of providing the third IDT electrode, the first to third IDT electrodes have electrode finger pitches that are different from one another.

In a method for manufacturing an elastic wave device according to a preferred embodiment of the present invention, in the step of forming the dielectric film, after a first dielectric film made of the same or substantially the same dielectric material as the dielectric film has been formed so as to cover the first to third IDT electrodes, a resist layer is formed on the first dielectric film in a region in which the first dielectric film covers the first IDT electrode, and the first dielectric film is etched.

In a method for manufacturing an elastic wave device according to a preferred embodiment of the present invention, in the step of forming the dielectric film, after a first dielectric film made of the same or substantially the same dielectric material as the dielectric film has been formed so as to cover the first to third IDT electrodes, a resist layer is formed on the first dielectric film in a region in which the first dielectric film covers the second and third IDT electrodes, and in addition, a second dielectric film made of the same or substantially the same dielectric material as the first dielectric film is formed on the first dielectric film, and then the resist layer is removed.

In a method for manufacturing an elastic wave device according to a preferred embodiment of the present invention, when the density equivalent thickness of the dielectric film is a thickness converted on an assumption that materials of the dielectric film and the first to third IDT electrodes have the same or substantially the same density, in the step of providing the first and second IDT electrodes, in the step of providing the third IDT electrode, and in the step of providing the dielectric film, a ratio of the sum of the density equivalent thickness of the dielectric film located on the first IDT electrode and the density equivalent thickness of the first IDT electrode to the electrode finger pitch of the first IDT electrode, a ratio of the sum of the density equivalent thickness of the dielectric film located on the second IDT electrode and the density equivalent thickness of the second IDT electrode to the electrode finger pitch of the second IDT electrode, and a ratio of the sum of the density equivalent thickness of the dielectric film located on the third IDT electrode and the density equivalent thickness of the third IDT electrode to the electrode finger pitch of the third IDT electrode are set to be different from one another. In this case, the insertion losses of the first to third elastic wave elements are effectively reduced.

In a method for manufacturing an elastic wave device according to a preferred embodiment of the present invention, the first to third elastic wave elements are first to third elastic wave filters.

In a method for manufacturing an elastic wave device according to a preferred embodiment of the present invention, the materials of the first and second IDT electrodes and the material of the third IDT electrode are different from each other.

According to preferred embodiments of the present invention, elastic wave devices capable of improving productivity and reducing insertion loss and methods for manufacturing the elastic wave devices are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to clarify the present invention.

Note that the preferred embodiments described in the present specification are examples, and the configurations according to the different preferred embodiments may be partially replaced with each other or may be combined with each other.

Figure 1:
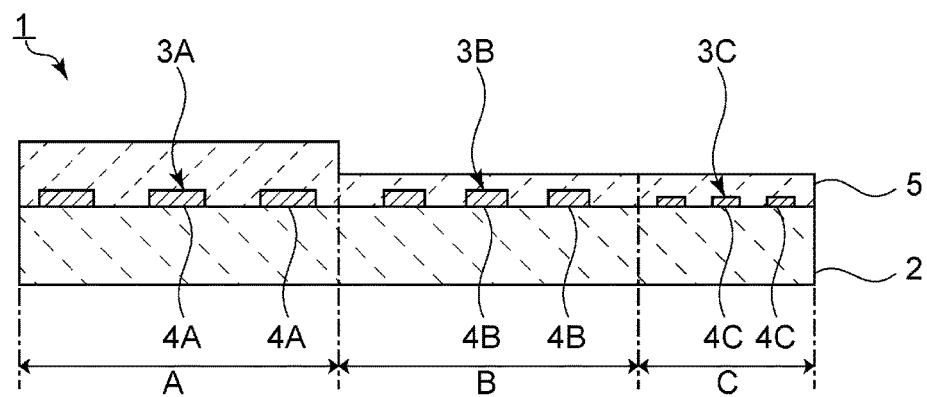
FIG. 1 is a schematic elevational cross-sectional view of an elastic wave device according to a preferred embodiment of the present invention.

FIG. 1 is a schematic elevational cross-sectional view according to a preferred embodiment of the present invention.

An elastic wave device 1 includes a piezoelectric substrate 2. The piezoelectric substrate 2 may preferably be made of a piezoelectric single crystal, such as $LiNbO_3$ or $LiTaO_3$, or may be made of a suitable piezoelectric ceramic, for example.

First to third IDT electrodes 4A to 4C are provided on the piezoelectric substrate 2. As in the present preferred embodiment, it is preferable that the electrode finger pitch of each of the first IDT electrodes 4A, the electrode finger pitch of each of the second IDT electrodes 4B, and the electrode finger pitch of each of the third IDT electrodes 4C are different from one another. Each of the first to third IDT electrodes 4A to 4C is preferably made of a suitable metal. Each of the first to third IDT electrodes 4A to 4C may include a single metal film or may include a multilayer metal film.

The first and second IDT electrodes 4A and 4B are preferably made of the same material. In contrast, in the present preferred embodiment, the third IDT electrodes 4C are preferably made of a material different from the material of the first and second IDT electrodes 4A and 4B. Note that the first to third IDT electrodes 4A to 4C may be made of the same material.

A dielectric film 5 is provided on the piezoelectric substrate 2 so as to cover the first to third IDT electrodes 4A to 4C. The dielectric film 5 includes a first region A in which the dielectric film 5 covers the first IDT electrodes 4A. The dielectric film 5 includes a second region B in which the dielectric film 5 covers the second IDT electrodes 4B, and a third region C in which the dielectric film 5 covers the third IDT electrodes 4C. In the elastic wave device 1, the thickness of the dielectric film 5 in the first region A is larger than the thickness of the dielectric film 5 in the second region B and the thickness of the dielectric film 5 in the third region C. Note that the thickness of the dielectric film 5 in the first region A may at least be different from the thickness of the dielectric film 5 in the second region B and the thickness of the dielectric film 5 in the third region C. For example, the thickness of the dielectric film 5 in the first region A may be smaller than the thickness of the dielectric film 5 in the second region B and the thickness of the dielectric film 5 in the third region C.

The dielectric film 5 is preferably made of $SiO_2$, for example. Note that the material of the dielectric film 5 is not limited to being made of $SiO_2$.

Here, the thicknesses of the dielectric film 5 and the first to third IDT electrodes 4A to 4C are converted into density equivalent thicknesses of the dielectric film 5 and the first to third IDT electrodes 4A to 4C on the assumption that the materials of the dielectric film 5 and the first to third IDT electrodes 4A to 4C have the same or substantially the same density. For example, these thicknesses may be converted into the density equivalent thicknesses on the assumption that all of the above-described materials have the density of AlCu. In this case, the density equivalent thickness of each of the first IDT electrodes 4A and the density equivalent thickness of each of the second IDT electrodes 4B are the same or substantially the same as each other. In contrast, in the present preferred embodiment, the density equivalent thickness of each of the third IDT electrode 4C is smaller than the density equivalent thickness of each of the first IDT electrodes 4A and the density equivalent thickness of each of the second IDT electrodes 4B. Note that, in the present specification, the term "substantially the same thickness" refers to the state in which there is only a small difference between the thicknesses of the IDT electrodes that has no significant influence on filter characteristics.

The density equivalent thickness of each of the first IDT electrodes 4A and the density equivalent thickness of each of the second IDT electrodes 4B may at least be different from the density equivalent thickness of each of the third IDT electrodes 4C. The density equivalent thickness of each of the first IDT electrodes 4A and the density equivalent thickness of each of the second IDT electrodes 4B may be smaller than the density equivalent thickness of each of the third IDT electrodes 4C.

In the elastic wave device 1, a first elastic wave filter 3A that includes the first IDT electrodes 4A and the dielectric film 5 and that defines and functions as a first elastic wave element is provided. Similarly, a second elastic wave filter 3B that includes the second IDT electrodes 4B and the dielectric film 5 and that defines and functions as a second elastic wave element and a third elastic wave filter 3C that includes the third IDT electrodes 4C and the dielectric film 5 and that defines and functions as a third elastic wave element are provided. The elastic wave device 1 is a triple filter that includes the first to third elastic wave filters 3A to 3C.

In the present preferred embodiment, the first elastic wave filter 3A is preferably a reception filter having, for example, a pass band of about 1,805 MHz or more and about 1,880 MHz or less, which is the reception band of the band 3. The second elastic wave filter 3B is preferably a reception filter having, for example, a pass band of about 2,110 MHz or more and about 2,170 MHz or less, which is the reception band of the band 1. The third elastic wave filter 3C is preferably a reception filter having, for example, a pass band of about 2,620 MHz or more and about 2,690 MHz or less, which is the reception band of the band 7.

Note that the pass bands of the first to third elastic wave filters 3A to 3C are not particularly limited. In addition, each of the first to third elastic wave filters 3A to 3C may be a transmission filter or a reception filter.

Figure 2:
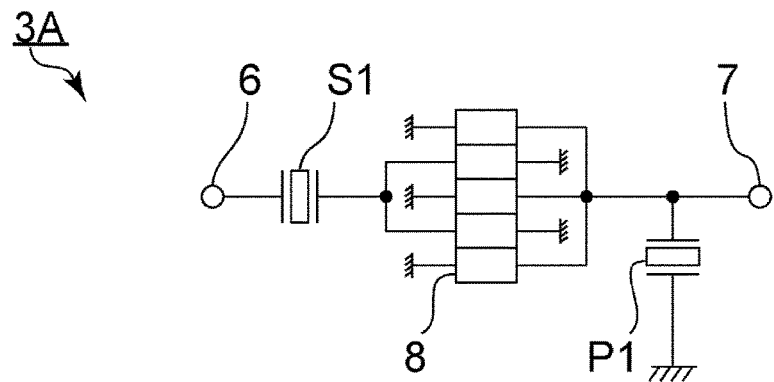
FIG. 2 is a circuit diagram of a first elastic wave filter according to a preferred embodiment of the present invention.

FIG. 2 is a circuit diagram of the first elastic wave filter according to the present preferred embodiment.

The first elastic wave filter 3A includes an input terminal 6 and an output terminal 7. The input terminal 6 is connected to an antenna terminal. Note that the antenna terminal is connected to an antenna. A longitudinally coupled resonator elastic wave filter 8 is connected between the input terminal 6 and the output terminal 7. A resonator S1 is connected between the input terminal 6 and the longitudinally coupled resonator elastic wave filter 8. A resonator P1 is connected between a connection point between the longitudinally coupled resonator elastic wave filter 8 and the output terminal 7 and a ground potential. The resonators S1 and P1 provide characteristics adjustment.

Although not particularly limited, the longitudinally coupled resonator elastic wave filter 8 is preferably, for example, a five-IDT, longitudinally coupled resonator elastic wave filter. In the present preferred embodiment, the first elastic wave filter 3A includes the plurality of first IDT electrodes 4A, which are illustrated in FIG. 1. The plurality of first IDT electrodes 4A are IDT electrodes of the longitudinally coupled resonator elastic wave filter 8.

The first elastic wave filter 3A and the second and third elastic wave filters are commonly connected to the antenna terminal. Note that the circuit configuration of the first elastic wave filter 3A is not limited to the above-described circuit configuration. The circuit configurations of the second and third elastic wave filters are also not particularly limited.

Returning to FIG. 1, in the present preferred embodiment, the thickness of the dielectric film 5 in the first region A is different from the thickness of the dielectric film 5 in the second region B and the thickness of the dielectric film 5 in the third region C, and the density equivalent thickness of each of the first IDT electrodes 4A and the density equivalent thickness of each of the second IDT electrodes 4B are different from the density equivalent thickness of each of the third IDT electrodes 4C. As a result, the productivity when manufacturing the elastic wave device 1 is improved, and the insertion loss is reduced. These matters will be described below together with a method for manufacturing the elastic wave device 1 according to the present preferred embodiment.

FIGS. 3A to FIG. 3D are schematic cross-sectional views illustrating a non-limiting example of a method for manufacturing the elastic wave device according to the present preferred embodiment.

Figure 3A:
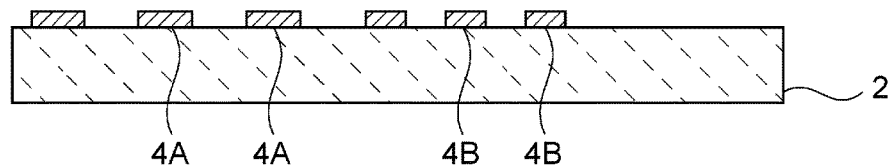
FIGS. 3A to 3D are schematic cross-sectional views illustrating a method for manufacturing the elastic wave device according to a preferred embodiment of the present invention.

As illustrated in FIG. 3A, the piezoelectric substrate 2 is prepared. Next, the first and second IDT electrodes 4A and 4B are provided on the piezoelectric substrate 2 such that the electrode finger pitch of each of the first IDT electrodes 4A and the electrode finger pitch of each of the second IDT electrodes 4B are different from each other. The first and second IDT electrodes 4A and 4B are provided in the same process and, thus, are made of the same material and have the same or substantially the same thickness.

Figure 3B:
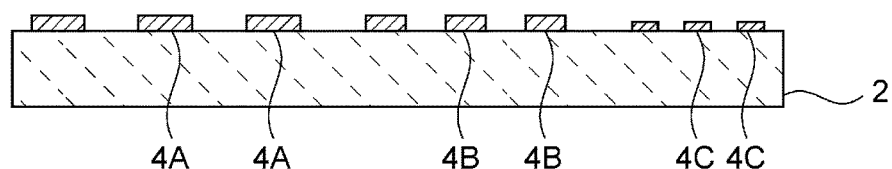

Next, as illustrated in FIG. 3B, the third IDT electrodes 4C are provided on the piezoelectric substrate 2 such that the electrode finger pitch of each of the third IDT electrodes 4C is different from the electrode finger pitch of each of the first IDT electrodes 4A and the electrode finger pitch of each of the second IDT electrodes 4B, and such that the density equivalent thickness of each of the third IDT electrodes 4C is different from the density equivalent thickness of each of the first IDT electrodes 4A and the density equivalent thickness of each of the second IDT electrodes 4B. In this case, the material of the first and second IDT electrodes 4A and 4B and the material of the third IDT electrodes 4C may be different from each other. As a result, materials that are more suitable for the respective IDT electrodes may be used in the first and second elastic wave filters and in the third elastic wave filter. Therefore, filter characteristics of the first to third elastic wave filters are improved.

Figure 3C:
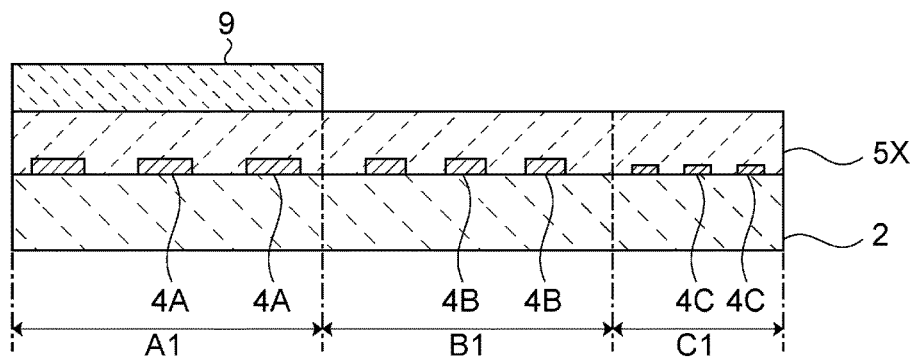

Next, as illustrated in FIG. 3C, a first dielectric film 5X is formed so as to cover the first to third IDT electrodes 4A to 4C. The first dielectric film 5X is made of the same dielectric material as the dielectric film 5 illustrated in FIG. 1.

Here, the ratio of the sum of the density equivalent thickness of the dielectric film and the density equivalent thickness of each of the IDT electrodes to the electrode finger pitch of the IDT electrode will be referred to as a total film thickness-electrode finger pitch ratio. In the process illustrated in FIG. 3C, the first dielectric film 5X is formed so as to have a thickness that causes the insertion loss of the above-mentioned first elastic wave filter to be low. More specifically, in the method for manufacturing the elastic wave device 1 according to the present preferred embodiment, the first dielectric film 5X is formed such that the total film thickness-electrode finger pitch ratio with respect to the first dielectric film 5X and the first IDT electrodes 4A is preferably, for example, about 10.7%.

Note that a preferable total film thickness-electrode finger pitch ratio varies depending on the materials of the IDT electrodes and the dielectric film and the pass band of the elastic wave filter. The thickness of the dielectric film may be adjusted such that the total film thickness-electrode finger pitch ratio has a desired value in the elastic wave filter.

Figure 3D:
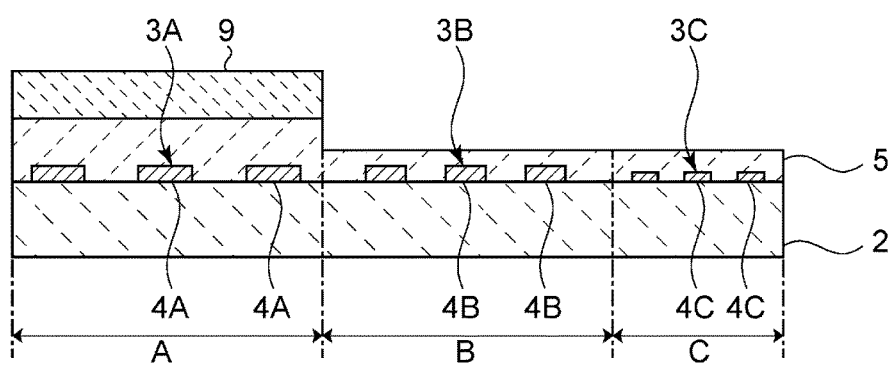

Next, a resist layer 9 is formed on the first dielectric film 5X in a first region A1 in which the first dielectric film 5X covers the first IDT electrodes 4A. Then, a second region B1 of the first dielectric film 5X in which the first dielectric film 5X covers the second IDT electrodes 4B and a third region C1 of the first dielectric film 5X in which the first dielectric film 5X covers the third IDT electrodes 4C are etched. As a result, as illustrated in FIG. 3D, the dielectric film 5 is obtained in which the thickness of the dielectric film 5 in the first region A is different from the thickness of the dielectric film 5 in the second region B and the thickness of the dielectric film 5 in the third region C.

Next, the resist layer 9 is removed. As a result, the elastic wave device 1 that includes the first to third elastic wave filters 3A to 3C illustrated in FIG. 1 is obtained.

The first and second IDT electrodes 4A and 4B are able to be simultaneously formed by the manufacturing method, and in the first region A, the total film thickness-electrode finger pitch ratio with respect to the dielectric film 5 and the first IDT electrodes 4A able to be set to a desired value. Therefore, the productivity is improved, and the insertion loss of the first elastic wave filter 3A is reduced.

Preferably, in the process illustrated in FIG. 3C, etching is performed such that the total film thickness-electrode finger pitch ratio with respect to the dielectric film 5 and the second IDT electrodes 4B or the total film thickness-electrode finger pitch ratio with respect to the dielectric film 5 and the third IDT electrodes 4C has a desired value. As a result, the productivity is improved, and the insertion loss of the first elastic wave filter 3A and the insertion loss of the second elastic wave filter 3B is reduced, or the insertion loss of the first elastic wave filter 3A and the insertion loss of the third elastic wave filter 3C are reduced.

More preferably, etching is performed such that the total film thickness-electrode finger pitch ratio with respect to the dielectric film 5 and the second IDT electrodes 4B and the total film thickness-electrode finger pitch ratio with respect to the dielectric film 5 and the third IDT electrodes 4C each have a desired value. Note that, in this case, in the processes illustrated in FIGS. 3A and 3B, the density equivalent thickness of each of the second IDT electrodes 4B and the density equivalent thickness of each of the third IDT electrodes 4C may be set such that the total film thickness-electrode finger pitch ratios each have a desired value. More specifically, the density equivalent thicknesses of the second and third IDT electrodes 4B and 4C may be adjusted such that the thickness of the dielectric film 5 in the second region B and the thickness of the dielectric film 5 in the third region C when the total film thickness-electrode finger pitch ratios each have a desired value are the same or substantially the same as each other. As a result, the productivity is improved, and the insertion losses of the first to third elastic wave filters 3A to 3C are effectively reduced.

Figure 4A:
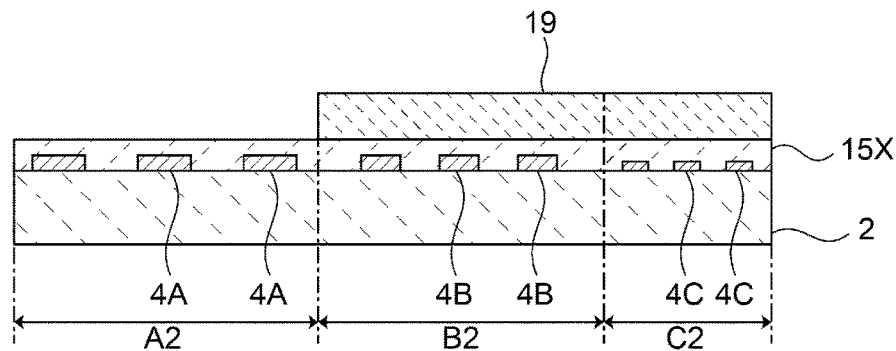
FIGS. 4A to 4C are schematic cross-sectional views illustrating a modification of a method for manufacturing the elastic wave device according to a preferred embodiment of the present invention.
Figure 4B:
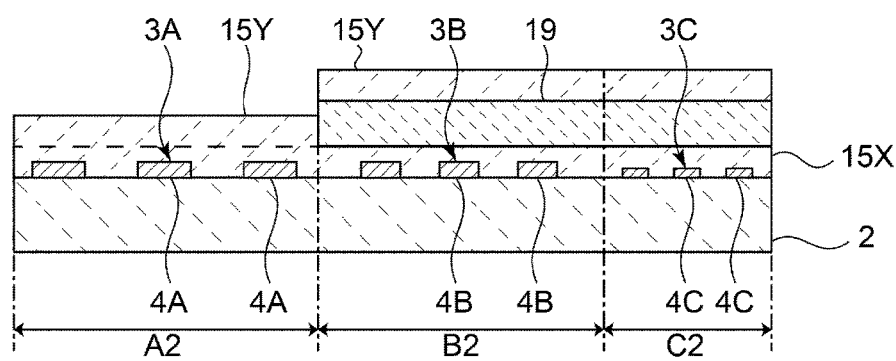
Figure 4C:
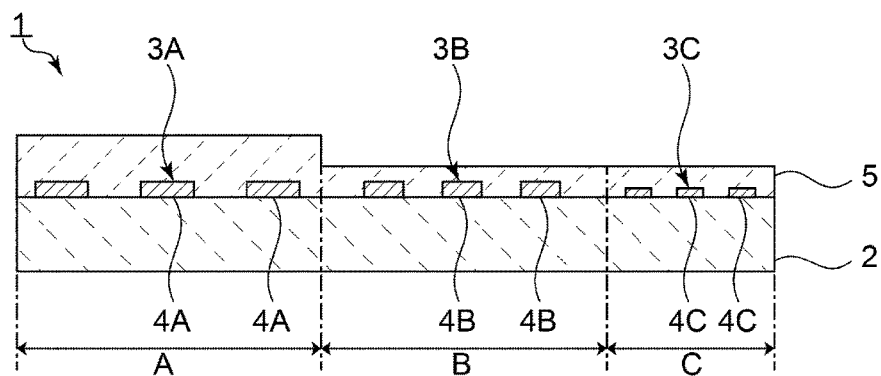

In the process illustrated in FIG. 3C, although the resist layer 9 is provided on the first dielectric film 5X in the first region A1, the elastic wave device 1 may also be obtained by a modification of the manufacturing method that is illustrated in FIGS. 4A to 4C. More specifically, as illustrated in FIG. 4A, a resist layer 19 may be provided on a first dielectric film 15X in second and third regions B2 and C2. In this case, subsequently, as illustrated in FIG. 4B, a second dielectric film 15Y is provided on the first dielectric film 15X in a first region A2 and on the resist layer 19. The second dielectric film 15Y is preferably made of the same or substantially the same dielectric material as the first dielectric film 15X. After that, the resist layer 19 is removed, and the elastic wave device 1 is obtained as illustrated in FIG. 4C.

Note that it is preferable that the thickness of the first dielectric film 15X illustrated in FIG. 4B is set to a thickness that causes the total film thickness-electrode finger pitch ratio with respect to the first dielectric film 15X and the second IDT electrodes 4B to have a desired value. Alternatively, it is preferable that the thickness of the first dielectric film 15X is set to a thickness that causes the total film thickness-electrode finger pitch ratio with respect to the first dielectric film 15X and the third IDT electrodes 4C to have a desired value. It is preferable that the thicknesses of the first and second dielectric films 15X and 15Y is set to thicknesses that cause the total film thickness-electrode finger pitch ratio with respect to each of the first and second dielectric films 15X and 15Y and the first IDT electrodes 4A to have desired values.

It will be described below by comparing the first preferred embodiment and a comparative example that the insertion loss in the first elastic wave filter 3A is reduced.

Figure 5:
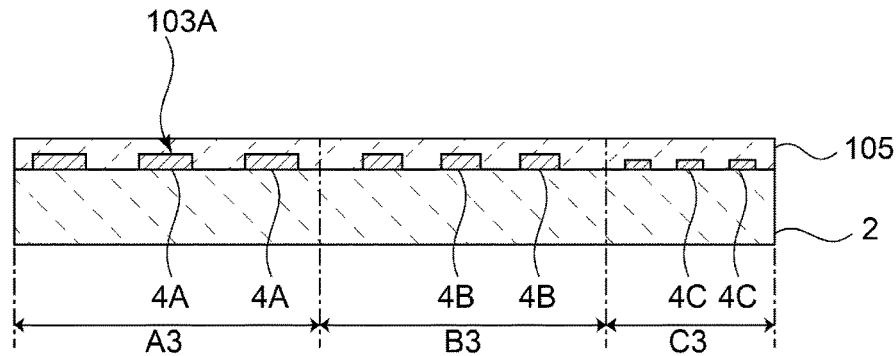
FIG. 5 is a schematic elevational cross-sectional view of an elastic wave device according to a comparative example.

As illustrated in FIG. 5, in the comparative example, the difference from the first preferred embodiment is that the thickness of a dielectric film 105 in a first region A3, the thickness of the dielectric film 105 in a second region B3, and the thickness of the dielectric film 105 in a third region C3 are the same as one another. In the comparative example, the thickness of the dielectric film 105 in the first region A3 is smaller than that in the first preferred embodiment. More specifically, the thickness of the dielectric film 105 in the first region A3 is the same as the thickness of the dielectric film 5 in the second region B and the thickness of the dielectric film 5 in the third region C according to the first preferred embodiment illustrated in FIG. 1. In a first elastic wave filter 103A according to the comparative example, the total film thickness-electrode finger pitch ratio with respect to the dielectric film 105 and the first IDT electrodes 4A is about 9.1%.

Figure 6:
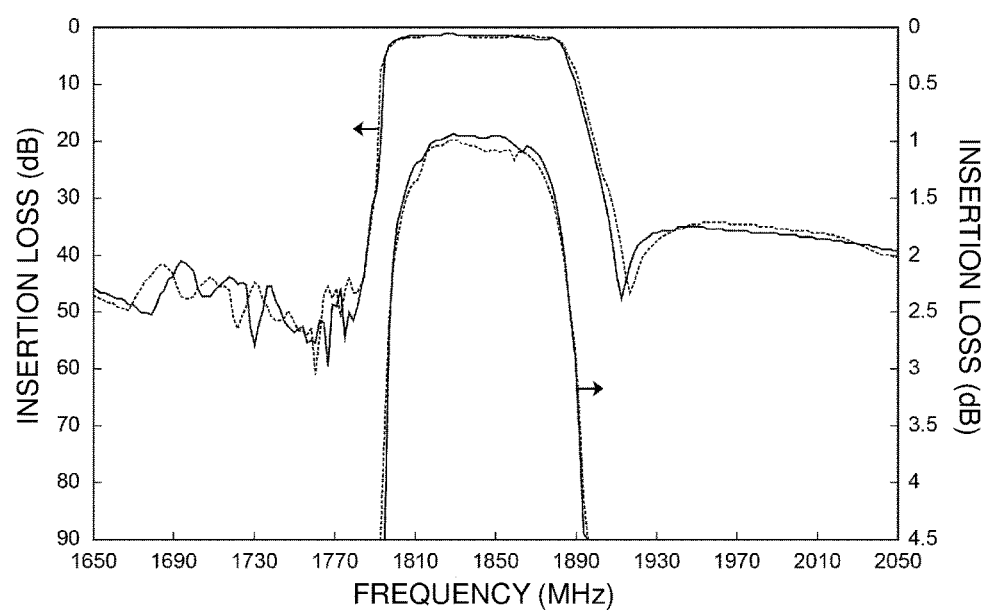
FIG. 6 is a graph illustrating attenuation frequency characteristics of the first elastic wave filter according to a first preferred embodiment of the present invention and attenuation frequency characteristics of a first elastic wave filter according to the comparative example.

FIG. 6 is a graph illustrating attenuation frequency characteristics of the first elastic wave filter according to the first preferred embodiment and attenuation frequency characteristics of the first elastic wave filter according to the comparative example. The results in the first preferred embodiment are indicated by a solid line, and the results in the comparative example are indicated by a dashed line.

As illustrated in FIG. 6, in the first preferred embodiment, the insertion loss is reduced to be lower than that in the comparative example. In the first preferred embodiment, the thickness of the dielectric film in the first region is different from the thickness of the dielectric film in the second region and the thickness of the dielectric film in the third region, and the total film thickness-electrode finger pitch ratio in the first elastic wave filter has a suitable value. Thus, the insertion loss of the first elastic wave filter is reduced. In addition, as described above, the productivity is improved.

Although FIG. 1 schematically illustrates the dielectric film 5, in the present preferred embodiment, the thickness of a portion of the dielectric film 5 located on the second IDT electrodes 4B and the thickness of a portion of the dielectric film 5 located on the third IDT electrodes 4C are the same or substantially the same as each other. The sum of the density equivalent thickness of each of the second IDT electrodes 4B and the density equivalent thickness of the dielectric film 5 and the sum of the density equivalent thickness of each of the third IDT electrodes 4C and the density equivalent thickness of the dielectric film 5 are different from each other.

Note that, in the second and third regions B and C, the dielectric film 5 may be flat. Accordingly, the sum of the density equivalent thickness of each of the second IDT electrodes 4B and the density equivalent thickness of the dielectric film 5 and the sum of the density equivalent thickness of each of the third IDT electrodes 4C and the density equivalent thickness of the dielectric film 5 may be the same or substantially the same as each other. Also in this case, it is preferable that the total film thickness-electrode finger pitch ratios in the first to third elastic wave filters 3A to 3C is different from one another. More preferably, each of the total film thickness-electrode finger pitch ratios in the first to third elastic wave filters 3A to 3C have a desired value.

In the elastic wave device 1, the thickness of the dielectric film 5 in the first region A is larger than the thickness of the dielectric film 5 in the second region B and the thickness of the dielectric film 5 in the third region C. Note that the thickness of the dielectric film 5 in the first region A may be smaller than the thickness of the dielectric film 5 in the second region B and the thickness of the dielectric film 5 in the third region C. In this case, a thickness relationship such as that described above may be satisfied by, for example, providing the resist layer 9 on the first dielectric film 5X in the second and third regions B1 and C1 in the process illustrated in FIG. 3C and then etching the first region A1 of the first dielectric film 5X.

Alternatively, in the process illustrated in FIG. 4A, the resist layer 19 may be provided on the first dielectric film 15X in the first region A2. In this case, subsequently, the second dielectric film 15Y is provided on the first dielectric film 15X in the second and third regions B2 and C2 and on the resist layer 19 in the process illustrated in FIG. 4B.

In the present preferred embodiment, the first to third elastic wave elements, which include the first to third IDT electrodes 4A to 4C, are the first to third elastic wave filters 3A to 3C. Note that the first to third elastic wave elements are not limited to elastic wave filters, and at least one elastic wave element among the first to third elastic wave elements may be, for example, an elastic wave resonator or other suitable elastic wave device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate;
first, second, and third IDT electrodes that are provided on the piezoelectric substrate; and
a dielectric film that is provided on the piezoelectric substrate such that the dielectric film covers the first, second, and third IDT electrodes, and such that a thickness of the dielectric film in a region in which the dielectric film covers the first IDT electrode is different from a thickness of the dielectric film in a region in which the dielectric film covers the second IDT electrode and a thickness of the dielectric film in a region in which the dielectric film covers the third IDT electrode; wherein
first, second, and third elastic wave elements that include the first, second, and third IDT electrodes and the dielectric film are provided; and
when a thickness is converted into a density equivalent thickness on an assumption that materials of the first, second, and third IDT electrodes have a same or substantially a same density, the density equivalent thicknesses of the first and second IDT electrodes are equal or substantially equal to each other, and the density equivalent thickness of the third IDT electrode is different from each of the density equivalent thicknesses of the first and second IDT electrodes.

2. The elastic wave device according to claim 1, wherein the first, second, and third IDT electrodes have electrode finger pitches that are different from one another.

3. The elastic wave device according to claim 1, wherein, when the density equivalent thickness of the dielectric film is a thickness converted on an assumption that materials of the dielectric film and the first, second, and third IDT electrodes have the same or substantially the same density, a ratio of a sum of the density equivalent thickness of the dielectric film located on the first IDT electrode and the density equivalent thickness of the first IDT electrode to the electrode finger pitch of the first IDT electrode, a ratio of a sum of the density equivalent thickness of the dielectric film located on the second IDT electrode and the density equivalent thickness of the second IDT electrode to the electrode finger pitch of the second IDT electrode, and a ratio of a sum of the density equivalent thickness of the dielectric film located on the third IDT electrode and the density equivalent thickness of the third IDT electrode to the electrode finger pitch of the third IDT electrode are different from one another.

4. The elastic wave device according to claim 1, wherein the first, second, and third elastic wave elements are first, second, and third elastic wave filters.

5. The elastic wave device according to claim 1, wherein the materials of the first and second IDT electrodes and the material of the third IDT electrode are different from each other.

6. A method for manufacturing an elastic wave device comprising:
   preparing a piezoelectric substrate;
   providing first and second IDT electrodes on the piezoelectric substrate;
   providing a third IDT electrode on the piezoelectric substrate; and
   forming a dielectric film on the piezoelectric substrate such that the dielectric film covers the first, second, and third IDT electrodes and such that a thickness of the dielectric film in a region in which the dielectric film covers the first IDT electrode is different from a thickness of the dielectric film in a region in which the dielectric film covers the second IDT electrode and a thickness of the dielectric film in a region in which the dielectric film covers the third IDT electrode; wherein
   first, second, and third elastic wave elements that include the first, second and third IDT electrodes and the dielectric film are formed; and
   in the step of providing the first and second IDT electrodes and in the step of providing the third IDT electrode, when a thickness is converted into a density equivalent thickness on an assumption that materials of the first, second, and third IDT electrodes have the same or substantially the same density, the density equivalent thicknesses of the first and second IDT electrodes are set to be equal or substantially equal to each other, and the density equivalent thickness of the third IDT electrode is set to be different from each of the density equivalent thicknesses of the first and second IDT electrodes.

7. The method for manufacturing an elastic wave device according to claim 6, wherein, in the step of providing the first and second IDT electrodes and in the step of providing the third IDT electrode, the first, second, and third IDT electrodes have electrode finger pitches that are different from one another.

8. The method for manufacturing an elastic wave device according to claim 6, wherein, in the step of forming the dielectric film, after a first dielectric film made of a same dielectric material as the dielectric film has been formed so as to cover the first, second, and third IDT electrodes, a resist layer is formed on the first dielectric film in a region in which the first dielectric film covers the first IDT electrode, and the first dielectric film is etched.

9. The method for manufacturing an elastic wave device according to claim 6, wherein, in the step of forming the dielectric film, after a first dielectric film made of a same dielectric material as the dielectric film has been formed so as to cover the first, second, and third IDT electrodes, a resist layer is formed on the first dielectric film in a region in which the first dielectric film covers the second and third IDT electrodes, and in addition, a second dielectric film made of a same dielectric material as the first dielectric film is formed on the first dielectric film, and then the resist layer is removed.

10. The method for manufacturing an elastic wave device according to claim 6, wherein, when the density equivalent thickness of the dielectric film is a thickness converted on an assumption that materials of the dielectric film and the first to third IDT electrodes have a same or substantially a same density, in the step providing the first and second IDT electrodes, in the step of providing the third IDT electrode, and in the step of providing the dielectric film, a ratio of a sum of the density equivalent thickness of the dielectric film located on the first IDT electrode and the density equivalent thickness of the first IDT electrode to the electrode finger pitch of the first IDT electrode, a ratio of a sum of the density equivalent thickness of the dielectric film located on the second IDT electrode and the density equivalent thickness of the second IDT electrode to the electrode finger pitch of the second IDT electrode, and a ratio of a sum of the density equivalent thickness of the dielectric film located on the third IDT electrode and the density equivalent thickness of the third IDT electrode to the electrode finger pitch of the third IDT electrode are set to be different from one another.

11. The method for manufacturing an elastic wave device according to claim 6, wherein the first, second, and third elastic wave elements are first, second, and third elastic wave filters.

12. The method for manufacturing an elastic wave device according to of claim 6, wherein the materials of the first and second IDT electrodes and the material of the third IDT electrode are different from each other.

* * * * *